United States Patent
Shedletsky et al.

(10) Patent No.: US 9,525,222 B2
(45) Date of Patent: Dec. 20, 2016

(54) REDUCING OR ELIMINATING BOARD-TO-BOARD CONNECTORS

(71) Applicant: Apple Inc., Cupertino, CA (US)

(72) Inventors: Anna-Katrina Shedletsky, Mountain View, CA (US); Nathan Guide, Sandown, NH (US)

(73) Assignee: Apple Inc., Cupertino, CA (US)

( * ) Notice: Subject to any disclaimer, the term of this patent is extended or adjusted under 35 U.S.C. 154(b) by 3 days.

(21) Appl. No.: 14/250,811

(22) Filed: Apr. 11, 2014

(65) Prior Publication Data

US 2015/0295332 A1    Oct. 15, 2015

(51) Int. Cl.
| | | |
|---|---|---|
| H01R 13/648 | (2006.01) |
| H01R 12/61  | (2011.01) |
| H05K 3/28   | (2006.01) |
| H05K 3/36   | (2006.01) |

(52) U.S. Cl.
CPC ............ H01R 12/613 (2013.01); H05K 3/284 (2013.01); H05K 3/361 (2013.01); H05K 3/363 (2013.01); H05K 2201/09754 (2013.01); H05K 2201/10424 (2013.01); H05K 2203/025 (2013.01)

(58) Field of Classification Search
CPC .......................... H01R 23/688; H01R 23/7073
USPC ................................. 439/607.01, 79
See application file for complete search history.

(56) References Cited

U.S. PATENT DOCUMENTS

| | | |
|---|---|---|
| 4,657,320 A | 4/1987 | Bamford et al. |
| 5,111,363 A | 5/1992 | Yagi et al. |
| 5,125,846 A | 6/1992 | Sampson et al. |
| 6,344,877 B1 | 2/2002 | Gowda et al. |
| 6,866,544 B1 * | 3/2005 | Casey ................. H05K 9/0058 439/607.2 |
| 7,106,261 B2 | 9/2006 | Nagel et al. |
| 7,123,292 B1 | 10/2006 | Seeger et al. |
| 7,130,174 B2 | 10/2006 | Miyai et al. |
| 7,380,948 B2 | 6/2008 | Schofield et al. |
| 7,619,899 B2 | 11/2009 | Rubenstein et al. |
| 7,822,338 B2 | 10/2010 | Wernersson |
| 7,978,489 B1 | 7/2011 | Telefus et al. |
| 7,989,709 B2 | 8/2011 | Tsao |
| 8,361,830 B2 | 1/2013 | Yang et al. |
| 8,385,258 B2 | 2/2013 | Perlman |

(Continued)

FOREIGN PATENT DOCUMENTS

WO    WO2012058295    5/2012

OTHER PUBLICATIONS

Author Unknown, "Copper Flex Products," www.molex.com, 6 pages, at least as early as Jul. 22, 2014.

*Primary Examiner* — Phuongchi T Nguyen

(57) ABSTRACT

Embodiments of the present disclosure provide a method for creating a connection mechanism for a circuit board. The method includes securing a plurality of electrical conductors to a sleeve. Once the electrical conductors have been coupled to the sleeve, the sleeve and the plurality of conductors are coupled to, and molded with, the circuit board. At least one side of the circuit board, such as, for example, the molding over the plurality of electrical conductors, is subsequently reduced to expose at least a portion of at least one of the plurality of electrical conductors. An electrical connector is then coupled to the at least the portion of the one or more of the plurality of electrical conductors that was exposed when the first side of the printed circuit board was reduced.

20 Claims, 8 Drawing Sheets

(56) References Cited

U.S. PATENT DOCUMENTS

| | | |
|---|---|---|
| 8,430,402 B2 | 4/2013 | Diehl et al. |
| 8,500,456 B1 | 8/2013 | Holec et al. |
| 8,708,746 B2 | 4/2014 | Altice et al. |
| 8,730,372 B2 | 5/2014 | Dabov |
| 8,905,684 B2 | 12/2014 | Waggle et al. |
| 9,035,326 B2 | 5/2015 | Cho |
| 9,074,915 B2 | 7/2015 | Kalhoff et al. |
| 2005/0095410 A1 | 5/2005 | Mazurkiewicz |
| 2005/0233122 A1 | 10/2005 | Nishimura et al. |
| 2007/0032130 A1 | 2/2007 | Yoshino |
| 2009/0213232 A1 | 8/2009 | Asakura et al. |
| 2010/0141571 A1 | 6/2010 | Chiang et al. |
| 2010/0177080 A1 | 7/2010 | Essinger et al. |
| 2011/0133208 A1 | 6/2011 | Nakahara |
| 2011/0155417 A1 | 6/2011 | Hu et al. |
| 2011/0304763 A1 | 12/2011 | Choi et al. |
| 2012/0049991 A1* | 3/2012 | Baarman ............ H01F 17/0013 336/199 |
| 2012/0270420 A1 | 10/2012 | Lapidot |
| 2013/0082984 A1 | 4/2013 | Drzaic et al. |
| 2014/0111953 A1 | 4/2014 | McClure et al. |
| 2014/0342577 A1 | 11/2014 | De Bruijn |
| 2015/0116958 A1 | 4/2015 | Shedletsky et al. |
| 2015/0138700 A1 | 5/2015 | Goyal et al. |
| 2015/0146355 A1 | 5/2015 | Goyal et al. |
| 2015/0194753 A1 | 7/2015 | Raff et al. |
| 2016/0021742 A1 | 1/2016 | Johansson et al. |
| 2016/0029503 A1 | 1/2016 | Shedletsky et al. |

\* cited by examiner

REDUCING OR ELIMINATING BOARD-TO-BOARD CONNECTORS

TECHNICAL FIELD

The present disclosure is directed to reducing or eliminating board-to-board connectors on circuit boards that are used in electronic computing devices. Specifically, one or more embodiments of the present disclosure are directed to the creation and use of a pin module connector that may be used in the place of a board-to-board connector on a printed circuit board.

BACKGROUND

Computing devices typically have a variety of printed circuit boards (PCB) and other electronic components and modules that are connected to one another using various connectors. Typically, board-to-board connectors are used in making the connections. A board-to-board connector typically includes housing and a number of terminals that transmit a current or a signal between the printed circuit board and the electronic components. However, as the housing is typically made of an insulating material, such as plastic, the board-to-board connectors may take up valuable space on the printed circuit board. Further, when board-to-board connectors are placed on the printed circuit board, a minimum distance may be required between the board-to-board connector and other components or connectors.

It is with respect to these and other general considerations that embodiments have been made. Also, although relatively specific problems have been discussed, it should be understood that the embodiments should not be limited to solving the specific problems identified in the background.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

One or more embodiments of the present disclosure provide a method for creating a connection mechanism for a circuit board. The method includes securing a plurality of electrical conductors to a sleeve. Once the electrical conductors have been coupled to the sleeve, the sleeve and the plurality of conductors are coupled to, and molded with, the circuit board. At least one side of the circuit board, such as, for example, the molding over the plurality of electrical conductors, is subsequently reduced to expose at least a portion of at least one of the plurality of electrical conductors. An electrical connector is then coupled to the at least the portion of the one or more of the plurality of electrical conductors that was exposed when the first side of the printed circuit board was reduced.

Also disclosed herein is printed circuit board that includes a plurality of electrical conductors coupled to a sleeve. In certain embodiments, the plurality of electrical conductors and the sleeve are molded, such as, for example, using an over-molding process, to the printed circuit board. At least a portion of the over-molded portion of the printed circuit board is subsequently reduced such that at least a portion of the plurality of electrical conductors are exposed. An electrical connector is then coupled to the at least the portion of the plurality of electrical conductors that have been exposed.

One or more embodiments also disclose a printed circuit board having a ganged pin connector coupled to the printed circuit board. In certain embodiments, the ganged pin connector is coupled to the printed circuit board and an over-molding process is applied to at least a portion of the printed circuit board on which the ganged pin connector is located. An electrical connector is then coupled to an exposed portion of the ganged pin connector. In some embodiments, the ganged pin connector is exposed by reducing at least a portion of the mold that covers the ganged pin connector.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
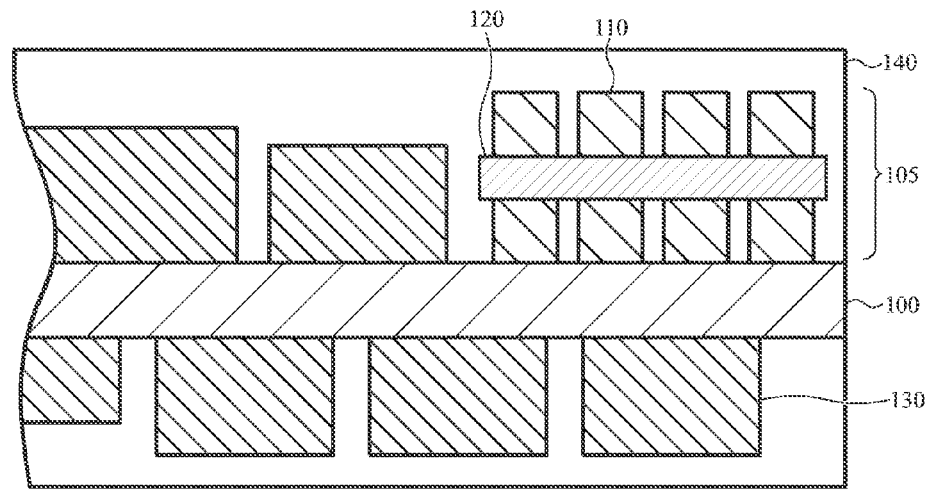
FIG. 1A illustrates a side-view of a printed circuit board having a pin connector according to one or more embodiments of the present disclosure.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

One or more embodiments of the present disclosure are directed to reducing or eliminating board-to-board connectors on printed circuit boards. In certain embodiments, the circuit boards may be used for various electronic devices including, but not limited to, mobile telephones, personal digital assistants, tablet, personal and laptop computers, media playback devices, televisions, remote controls, and the like.

As electronic devices become smaller, the space within any given device becomes more valuable and adding functionality in the form of electronic circuits, modules, components and the like becomes more difficult. In some instances, connectors (such as board-to-board connectors) consume a large percentage of the available space on a circuit board within an electronic device. As such, smaller connectors, or connectors that do not require offsets from other components, may be useful and may free up space on a circuit board. Although specific examples are given, it is contemplated that this disclosure may be applied to a device that requires a circuit board or requires computing modules to be mounted or otherwise coupled to a substrate.

Some electronic devices contain printed circuit boards in which a portion or all of the printed circuit boards are over-molded with a resin to encapsulate one or more components. Once the components have been encapsulated by the molding, a conductive material may be applied to portions of the molding or to portions of the printed circuit board to shield the components from interference (e.g., electromagnetic interference). However, this over-molding process may make the integration of traditional board-to-board connectors or other such connectors on the printed circuit board more challenging. For example, some of these connectors typically need to be isolated to zones where no over-molding has been applied. As such, a minimum keep-out space or distance may be required between the molded and un-molded areas. This minimum keep-out distance may be required to make way for a tooling process that defines the molding edge.

For example, some board-to-board connectors may require a one millimeter keep-out distance between the board-to-board connector and another computing module. As embodiments of the present disclosure do not require the use of the board-to-board connectors, a minimum molding keep-out distance is not required. As such, the space that is typically used for the minimum keep-out region (e.g., the space between the connector and the molding) can be used for other purposes. This, in turn, may enable: (i) a reduction in the space that the connections consume on the printed circuit board; (ii) closer packing of components to the connectors on the printed circuit board; and/or (iii) a possible reduction in the size of the printed circuit board in favor of other components.

FIG. 1A illustrates a side-view of a printed circuit board 100 having a pin connector 105 according to one or more embodiments of the present disclosure. As will be explained below, the pin connector may include a plurality of pins 110 coupled to a sleeve 120. Although a specific number of pins 110 is shown, it is contemplated that the pin connector 105 may have any number of pins 110. Further, it is contemplated that the plurality of pins 110 may be arranged in any desired shape or pattern. For example, the pins 110 may be arranged in an n×m row and column arrangement. Further, the pins 110 may be arranged in a "T" shape or may be staggered such as shown, for example, in FIG. 1G. Although specific shapes and arrangements of the pins is mentioned, the pins may be arranged in any other suitable shape, including circular, irregular, rectilinear, and so on. Examples of such shapes or arrangement is shown in FIG. 1H. Further, although the pins are shown in a staggered arrangement, the pins may be aligned. Such alignment is shown with respect to FIG. 1I.

In certain embodiments, the plurality of pins 110 is ganged together with the sleeve 120. As such, during the manufacturing processes, the pins 110 may be inserted directly into the sleeve 120 as the sleeve is manufactured. For example, the pins 110 may be insert molded with the sleeve 120. In another embodiment, the sleeve may be molded and the pins 110 may be inserted directly into the molded sleeve 120. Still further, the pins 110 may be surface mounted directly onto the printed circuit board 100. In still another embodiment, a zirconia sleeve may have one or more holes passing therethrough. Molten metal may be extruded directly through the sleeve. This process may create a hermetic seal that may improve the reliability of the connector should the connector be exposed to high humidity or other potential contaminations. The pins 110 may also include a barb (not shown) or other such protrusion. The barb may help hold the pins 110 in place once the pins 110 have been inserted into the sleeve 120 or when the pins 110 are surface mounted to the printed circuit board 100.

Once the pin connector 105 has been created, one or more embodiments provide that the pin connector 105 is coupled to the printed circuit board 100. The pin connector 105 may be coupled to the printed circuit board 100 by a soldering process. For example, the pin connector 105 may be coupled to the printed circuit board 100 by any of: (i) a hot-bar soldering process; (ii) a pick and place surface mount assembly soldering process; (iii) using anisotropic conductive film (ACF) pads; and (iv) any other suitable connection method or structure. Regardless of the connection method, one or more embodiments provide that the pins 110 of the pin connector 105 are electrically coupled to one or more traces on the printed circuit board 100.

As will be described below, the pin connector 105 may be used to interconnect various components or modules contained on the printed circuit board instead of standard board-to-board connectors. In certain embodiments, the components or modules may be placed in closer proximity to the pin connector 105 because the pin connector 105 is designed to be over-molded. As such, no keep-out distance is required between the pin connector 105 and any of the components on the printed circuit board because the components and the pin connector 105 may be co-located inside a cavity of a molding tool.

Further, one or more embodiments provide that the pin connector 105 may enable several smaller board-to-board connectors to be combined into a single, larger, connector which may eliminate overhead required between board-to-board connectors when they are placed onto printed circuit boards. As such, the various modules and other electronic components of the printed circuit board 100 may be placed on the printed circuit board 100 in a higher density arrangement than printed circuit boards that use board-to-board connectors.

As shown in FIG. 1A, the printed circuit board 100 may also have one or more modules 130 disposed thereon. In embodiments, the printed circuit board 100 may be configured such that modules 130 may be coupled to both sides of the printed circuit board 100. Although FIG. 1A shows modules 130 coupled to both sides of the printed circuit board 100, it is contemplated that the printed circuit board 100 may be configured such that modules 130 are coupled to just one side.

In certain embodiments, the modules 130 may be integrated circuits, discrete components, or a combination thereof. Depending on the electronic device that the printed circuit board 100 is manufactured for, the modules 130 may include one or more processors, one or more sensors and/or various other components. As discussed, the modules 130 may also include discrete components such as, for example, transistors, capacitors, resistors and the like.

Once the modules 130 and the pin connector 105 have been coupled to the printed circuit board 100, the printed circuit board 100, or at least a portion of the printed circuit board 100 on which the pin connector 105 and the modules 130 are located, is subjected to a molding process. In certain embodiments, the molding process is an over-molding process in which a molded layer is applied to at least a portion of the printed circuit board 100 such that the mold forms around the desired portion of the printed circuit board 100. For example, and as shown in FIG. 1A, a mold 140 surrounds the pin connector 105 as well the modules 130 that have been coupled to the printed circuit board 100. Because the pins 110 are subjected to the over-molding process, resin from the over-molding process may fall in between each pin 110. The resin may help the pins 110 stay in the desired orientation and arrangement. Further, the resin that flows between the pins 110 during the molding process can protect the pins 110 from shorting and/or corrosion (one example of which is dendrite growth). However, in certain embodiments, the resin may not flow between the pins 110. In certain embodiments, the pins 110 may be flush with respect to the top of the sleeve 120 prior to the molding process. As such, the sleeve 120 may provide the same protection as the molding does in the previous embodiment.

Although each module 130 is shown as being surrounded by the mold 140, it is contemplated that some modules 130 may be subjected to the over-molding process while other modules 130 may not be subjected to the over-molding process. Further, a first portion or side of the printed circuit board may be subjected to a molding process while another portion or side of the printed circuit board 100 is not subjected to a molding process.

Figure 1B:
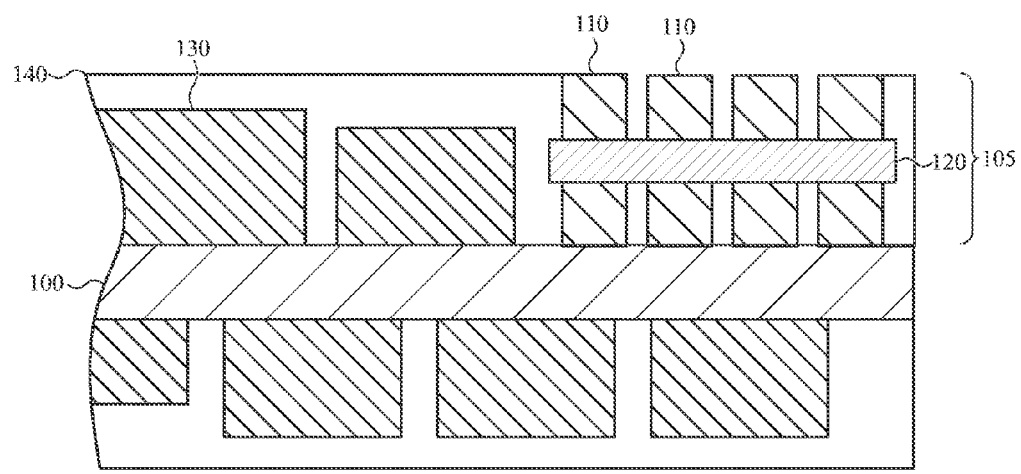
FIG. 1B illustrates a side-view of the printed circuit board having the pin connector in which at least one side of the printed circuit board has been reduced according to one or more embodiments of the present disclosure.

FIG. 1B illustrates a side-view of the printed circuit board 100 having the pin connector 105 in which at least one side of the printed circuit board has been reduced according to one or more embodiments of the present disclosure. As discussed above with respect to FIG. 1A, the printed circuit board, or a portion thereof, may be subjected to an over-molding process. Due to this process, the entire pin connector 105 may be surrounded by plastic or other such material. Thus, in order to access the pins 110 of the pin connector 105, one more embodiments provide that at least one side of the printed circuit board is reduced.

In certain embodiments, the portion of the printed circuit board 100 that includes the mold 140 is sanded down or otherwise reduced (e.g., by using a grinding process) such that at least a portion of the pins 110 of the pin connector 105 are exposed. In embodiments, the reduction process may also be used to ensure that the resultant mold 140 from the over-molding process is uniform or substantially uniform across the entire molded portion of the printed circuit board 100. Although the printed circuit board 100 undergoes the reduction process, it is contemplated that the modules 130 may still be contained within the mold. However, it is also contemplated that one or more of the modules 130, or portions thereof may also be exposed by the reduction process if needed. Although sanding and grinding are specifically mentioned, one or more embodiments provide that the pins may be exposed using an etching process, a combination of an etching and reduction process, or other such method in which portions of the pins 110 may be at least partially exposed.

Figure 1C:
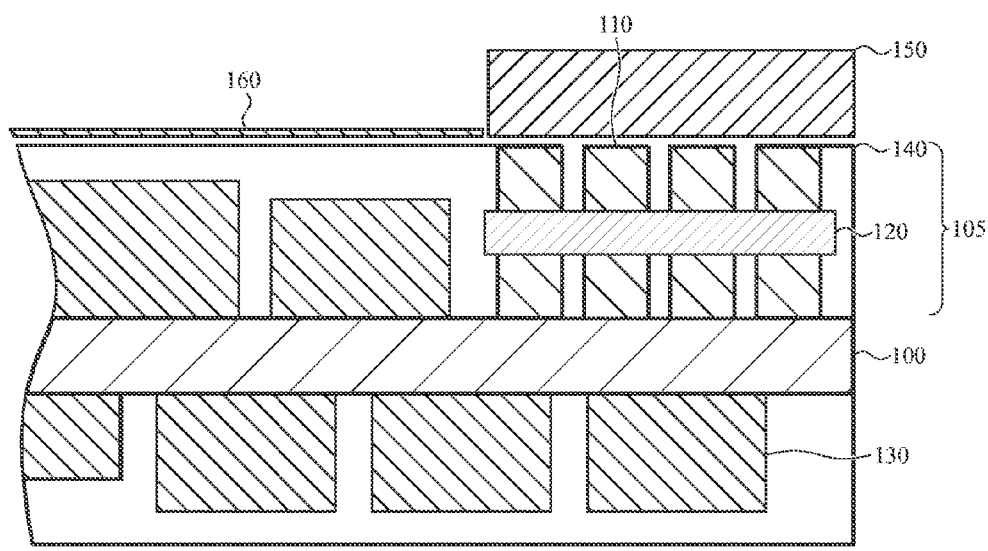
FIG. 1C illustrates a side view of the printed circuit board having a pin connector in which the reduced portion of the printed circuit board is subjected to a masking and sputtering process according to one or more embodiments of the present disclosure.

Referring now to FIG. 1C, FIG. 1C illustrates a side view of the printed circuit board 100 having a pin connector 105 in which the reduced portion of the printed circuit board 100 is subjected to a masking and sputtering process according to one or more embodiments of the present disclosure. In certain embodiments, the masking and sputtering process may be used to form an electromagnetic shield 160 around at least the molded portion of the printed circuit board 100. The shielding formed by the sputtering process may be an electromagnetic shield or the like. As shown in FIG. 1C, a mask 150 may be placed over the pins 110 to protect the pins 110 from shorting out or otherwise becoming exposed to the electromagnetic shield 160. Once the sputtering process is complete, the mask 150 may be removed from the pins 110. In other embodiments, the entire module may be subjected to the sputtering process and the connector region then subjected to a reduction process to remove the conductive outer layer and expose the pins 110.

Figure 1D:
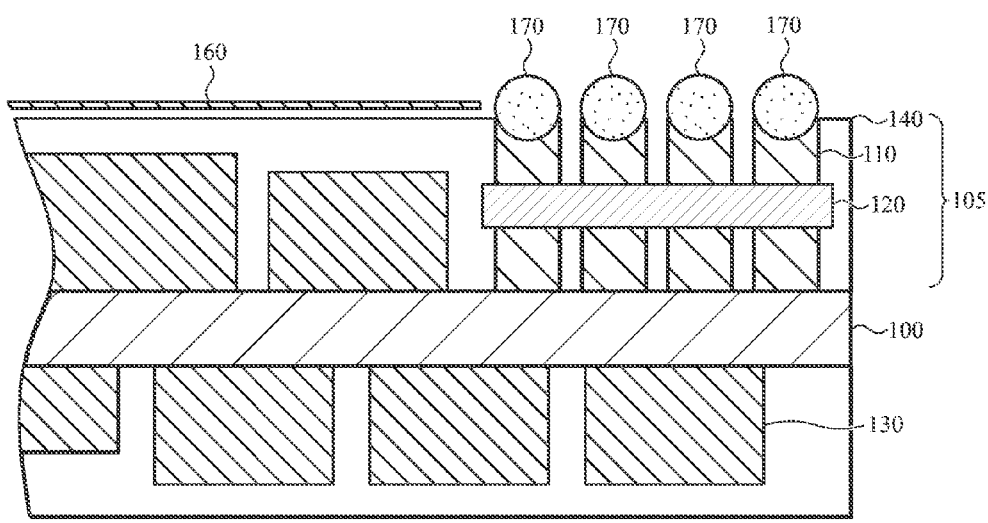
FIG. 1D illustrates a side view of the printed circuit board having a pin connector in which solder bumps have been disposed thereon according to one or more embodiments of the present disclosure.

FIG. 1D illustrates a side view of the printed circuit board 100 having a pin connector 105 in which solder bumps 170 have been disposed thereon according to one or more embodiments of the present disclosure. In such embodiments, the solder bumps 170 may be placed on the pins 110. As will be explained below, the solder bumps 170 may be used to couple (e.g., hot-bar, ACF, etc.) an electrical connector to the pins 110. In certain embodiments, this type of coupling may enable an electrical connector to be removed from the pins 110 which may enable the printed circuit board 100 to be subsequently reused.

Figure 1E:
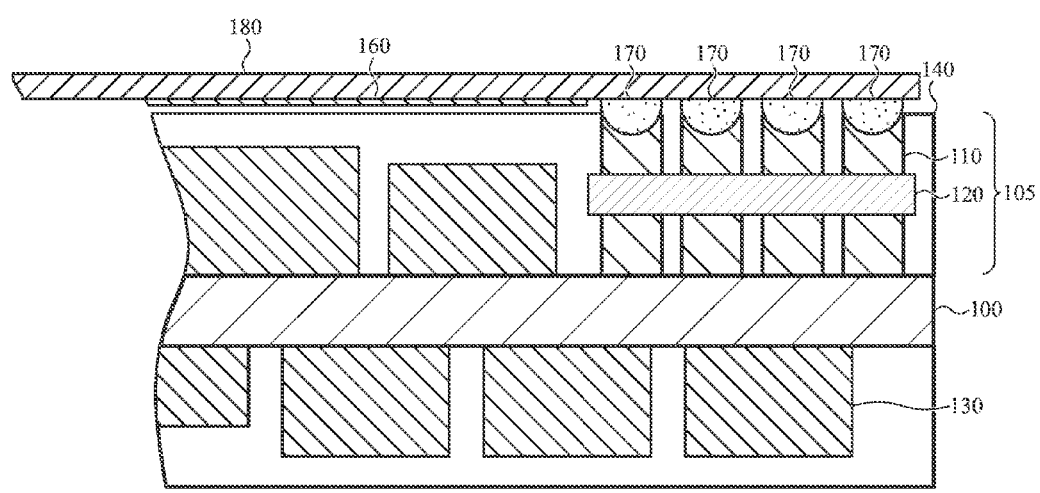
FIG. 1E illustrates a side view of the printed circuit board having a pin connector that is coupled to an electrical connector according to one or more embodiments of the present disclosure.

FIG. 1E illustrates a side view of the printed circuit board 100 having the pin connector 105 that is coupled to an electrical connector 180 according to one or more embodiments of the present disclosure. In certain embodiments, the electrical connector 180 is a flexible connector. The flexible connector may be used to couple one or more components or modules of the printed circuit board, or of the electronic device in which the printed circuit board 100 is contained, to the pin connector 105. The electrical connector 180 may be coupled or soldered to the pins using a hot-bar or ACF process.

Figure 1F:
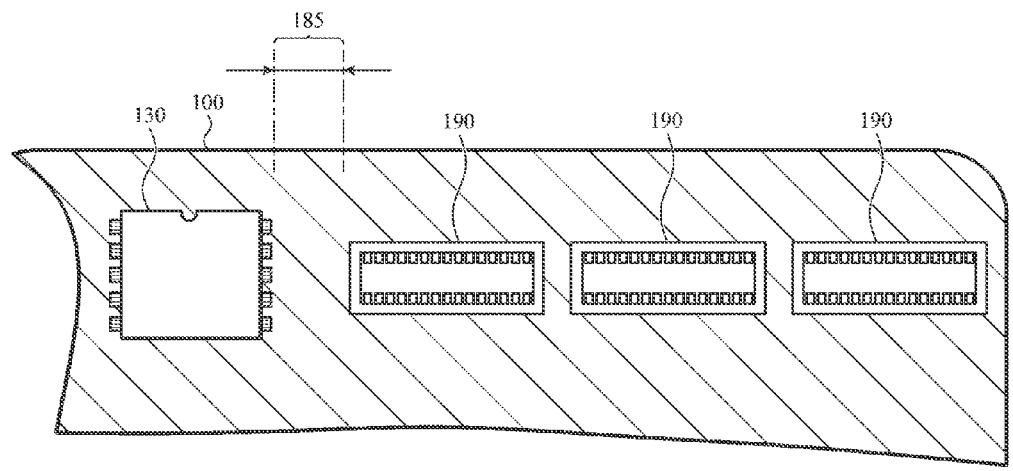
FIG. 1F illustrates a top view of a printed circuit board having a minimum keep-out distance between components that are coupled to the printed circuit board.

FIG. 1F illustrates a top view of a printed circuit board 100 having a minimum keep-out distance 185 between various components on the printed circuit board. For example, as shown in FIG. 1F, in certain implementations when standard board-to-board connectors are used, a minimum keep-out distance 185 is typically required between the board-to-board connector 190 and another component located on the printed circuit board 100, such as, for example, a module 130. As another example, a minimum transition region is typically required between a molded region on the board and an unmolded region of the board. In some implementations, the keep-out distance may be approximately one millimeter although other distances are used and contemplated. As also shown in FIG. 1F, because a minimum keep-out distance 185 may be required between the board-to-board connector 190 and the module 130, the overall size of the printed circuit board 100 may need to be larger or a fewer number of components or modules 130 may be placed on the printed circuit board 100.

Figure 1G:
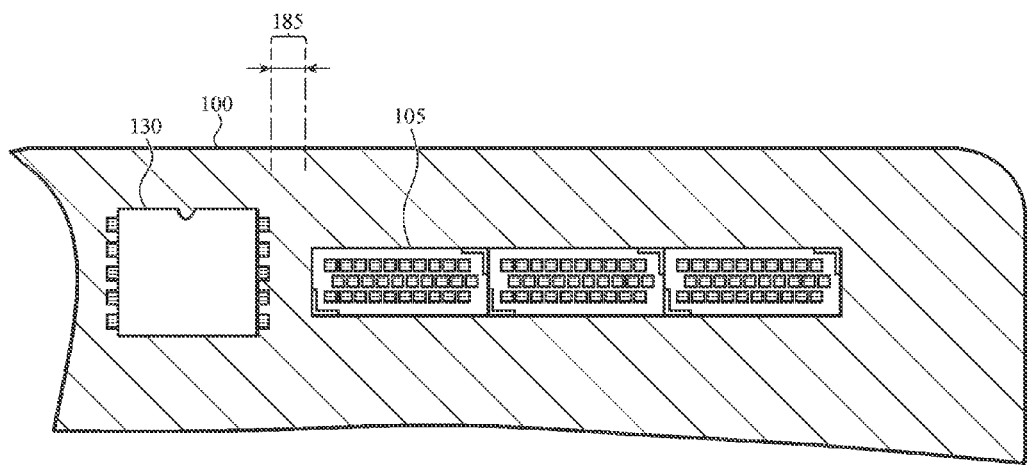
FIG. 1G. illustrates a top view of a printed circuit board having a pin connector according to one or more embodiments of the present disclosure.
Figure 1H:
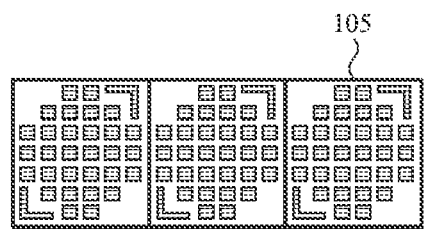
FIG. 1H illustrates a top view of a printed circuit board having a pin connector in which the pins are arranged in an alternative arrangement according to one or more embodiments of the present disclosure.
Figure 1I:
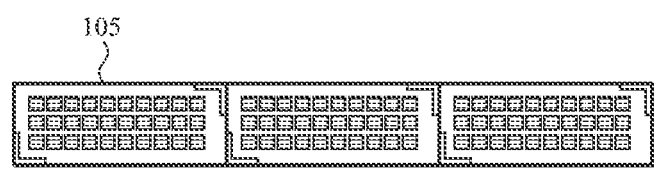
FIG. 1I illustrates a top view of a printed circuit board having a pin connector in which the pins are arranged in an yet another alternative pattern according to one or more embodiments of the present disclosure.

In contrast to FIG. 1F, FIG. 1G illustrates a top view of a printed circuit board 100 having a pin connector 105 according to one or more embodiments of the present disclosure. As shown in FIG. 1G, the space 195 between the pin connector 105 and the module 130 is much smaller when compared to the keep-out distance 185 required by FIG. 1F. Specifically, and as discussed above, the connector 190 of FIG. 1F is placed on a zone in which no over-molding is applied, while module 130 may be molded or overmolded to the board 100. As a minimum a keep-out distance is typically required between the molded and the un-molded areas, a space is present between each of the board-to-board connectors and also between the board-to-board connectors and other components.

However, in contrast to FIG. 1F, FIG. 1G shows that the space that was previously reserved for the minimum keep-out distance can be used for other purposes. For example, the module 130 may abut (or nearly abut) the connector 105. As a result, there may be a reduction in space that the connections consume on the printed circuit board, the components on the printed circuit board may be placed closer to the connectors on the printed circuit board, and the overall size of the printed circuit board may be reduced to make room for other components.

Figure 2:
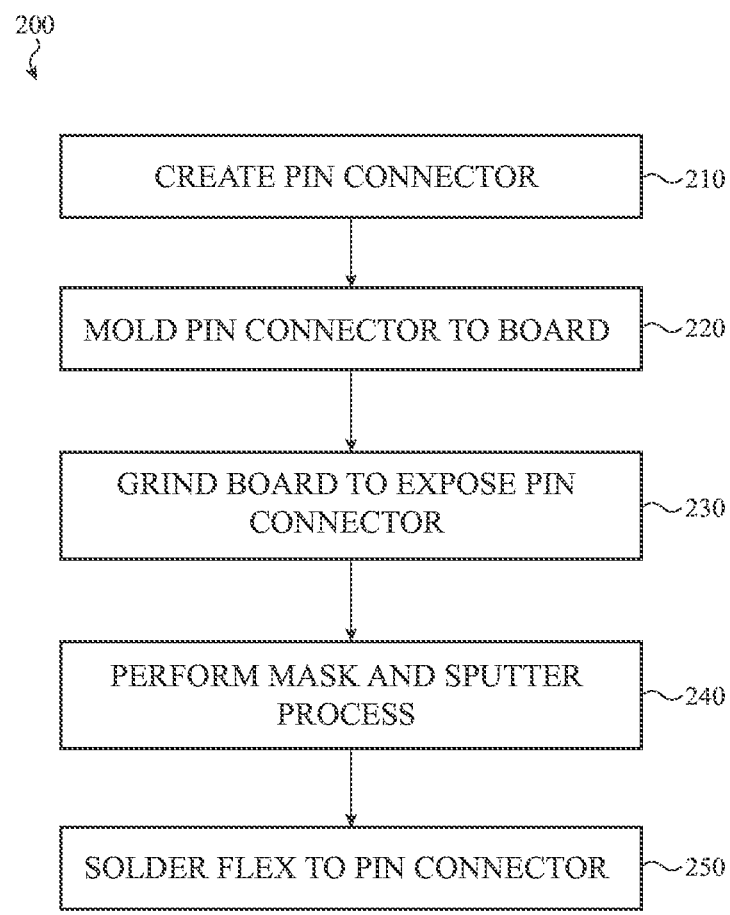
FIG. 2 illustrates a method for coupling an electrical connector to a circuit board according to one or more embodiments of the present disclosure.

FIG. 2 illustrates a method 200 for coupling an electrical connector to a circuit board according to one or more embodiments of the present disclosure. In certain embodiments, the method 200 may be used to produce the printed circuit board 100 shown and described with respect to FIG. 1.

Method 200 begins when a pin connector is created. In certain embodiments, the pin connector may be the pin connector 105 shown and described above with respect to FIG. 1A. The pin connector may be comprised of a plurality of pins that are insert molded or otherwise coupled to a sleeve or other such mechanism that enables the pins to be ganged together. It is contemplated that the pins may be arranged with any desired spacing, order, orientation or pattern. Further, it is contemplated that various numbers and sizes of pins may be used. It is also contemplated that a plurality of pin connectors may be placed on a single printed circuit board with each of the plurality of pin connectors having the same arrangement of pins or a different arrangement of pins. For example, a first pin connector may have a first number of pins arranged in a first order and having a first length, while a second pin connector may have a second number pins that are arranged in a second order having a second length. In certain embodiments, the pins in the first pin connector may have a first size (e.g., 0.18 mm) while the pins of the second connector may have a second size that is different than the first size (e.g., 0.19 mm). It is also contemplated that one or more pins of a connector may be a first size while one or more other pins of the same connector are of a different size, shape, diameter, thickness, or the like.

For example, in certain embodiments, the pins may have different sizes to account for different current requirements. Pins conducting power may be larger than pins conducting a data signal, as one specific example. Although various arrangements, sizes and spacing of pins have been discussed, it is contemplated that the arrangement, size and spacing of the pins may be set based on constraints resulting from an attachment process of a mating side of a connector. The use of a fiducial pin or marking, as discussed below with respect to FIGS. 3A-3B, may also reduce or relax the aforementioned constraints.

Once the pin connector has been created, flow proceeds to operation 220 in which the pin connector is coupled to a printed circuit board and subsequently subjected to a molding process. In embodiments, the pin connector is coupled to the printed circuit board by a soldering process such as, for example, a hot-bar soldering process or a pick and place surface mount assembly soldering process. In other embodiments, the pin connector is coupled to the printed circuit board using ACF pads and the like. Once the pin connector has been coupled to the printed circuit board, the printed circuit board, or a portion thereof, is subjected to a molding process. In embodiments, the molding process may be an over-molding process in which the pin connector and one or more modules that have been coupled to the printed circuit board are covered by a resin.

Flow then proceeds to operation 230 in which the molded portion of the printed circuit board is exposed to a reduction or grinding process. Specifically, the molded portion of the printed circuit board may be sanded down or otherwise reduced so as to expose at least a portion of the pins of the pin connector.

Once the reduction process is complete, operation 240 provides that the exposed pins are masked and the printed circuit board is subjected to a sputtering process. In embodiments, the sputtering process provides an electromagnetic shield on the printed circuit board. Flow then proceeds to operation 250 and an electronic connector, such as, for example, a flexible connector, is coupled to the exposed pins. In embodiments, the electronic connector is coupled to the exposed pins using an ACF process, a hot-bar process and the like.

Figure 3A:
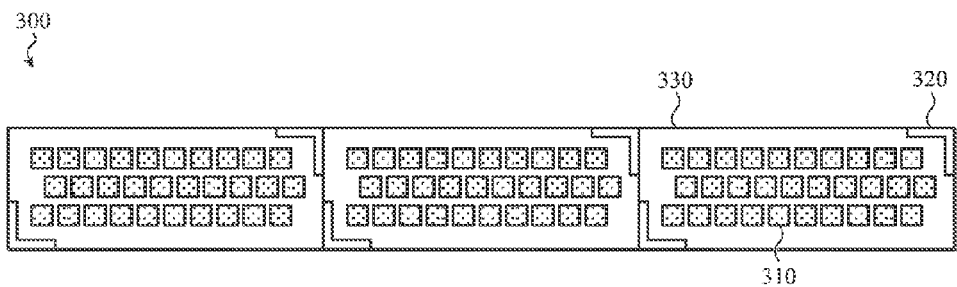
FIG. 3A illustrates a top view of a pin connector according to one or more embodiments of the present disclosure.
Figure 3B:
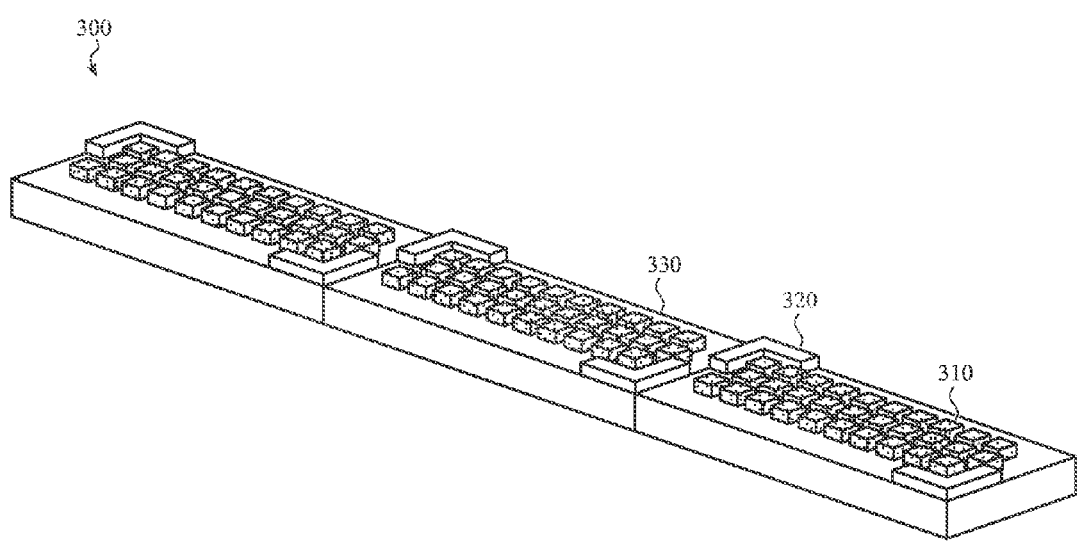
FIG. 3B illustrates an isometric view of a pin connector according to one or more embodiments of the present disclosure.

FIG. 3A illustrates a top view of a pin connector 300 according to one or more embodiments of the present disclosure and FIG. 3B illustrates an isometric view of the pin connector 300 according to one or more embodiments of the present disclosure. In certain embodiments, the pin connector 300 shown in FIG. 3A and FIG. 3B may be equivalent to the pin connector 105 shown and described above with reference to FIG. 1A-FIG. 1E.

As shown in FIG. 3A and FIG. 3B, the pin connector 300 may include a plurality of pins 310 arranged in an n×m row and column arrangement, or other suitable arrangements as described herein. It is also contemplated that the pins 310 may have a variety of arrangements based on the need of the connector. In embodiments, the pins 310 are 0.18 mm pins although other sizes are contemplated. The pins 310 may also be spaced such that the pins 310 have a 0.25 mm pitch from the center of one pin to the center of another pin.

As discussed above, the pins 310 are first covered in a mold, such as, for example, mold 330. However, as the printed circuit board is subjected to a reduction or grinding process, the pins 310 of the pin connector 300 may protrude from the mold 330 such as shown in FIG. 1B. In certain embodiments, the pin connector 300 may also include a fiducial marking 320 configured to help align an electrical connector to the pin connector 300 prior to coupling the electrical connector to the pin connector 300. The fiducial marking 320 may be insert molded into a sleeve of the pin connector 300 or otherwise coupled to the pin connector. Although a fiducial marking 320 is specifically described, it is contemplated that an edge of one or more of the pins may also serve as an alignment mechanism. As such, a fiducial marking 320 may not be needed.

Figure 4A:
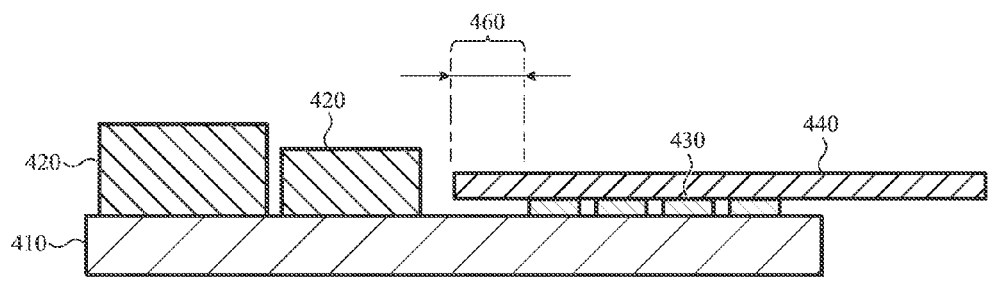
FIG. 4A illustrates a side view of the printed circuit board having a connector coupled to a plurality of pads.

FIG. 4A illustrates a side view of the printed circuit board 410 having a connector 440 coupled to a plurality of pads 430. As illustrated in FIG. 4A, the printed circuit board 410 may have various components 420 coupled thereon. However, unlike the embodiments shown and described above, the components 420 may not be over-molded to the printed circuit board 410. Accordingly, a connector 440, such as, for example, a flex connector, may be coupled directly to one or more pads 430 (e.g., hot bar pads or the like) on a surface of the printed circuit board 410. However, when the connector 440 is coupled to the printed circuit board 410, a keep-out distance may be required to account for an overlap 460 of the connector 440. Because an overlap 460 may be required for this type of connection, (e.g., typically a 0.25 mm copper to edge keep-out distance is required for such connections), valuable space on the printed circuit board 410 may be lost.

In certain embodiments, the printed circuit board 415 may have a plurality of components 425 coupled thereon. However, unlike the embodiments described above, it is contemplated that some of the components 425, or portions of the printed circuit board 415, may not be subjected to an over-molding process. As such, when a connector 445, such as, for example, a flex connector, is coupled to the printed circuit board 415, a keep-out distance may be required to account for an overhang 465 of the connector 445.

Figure 4B:
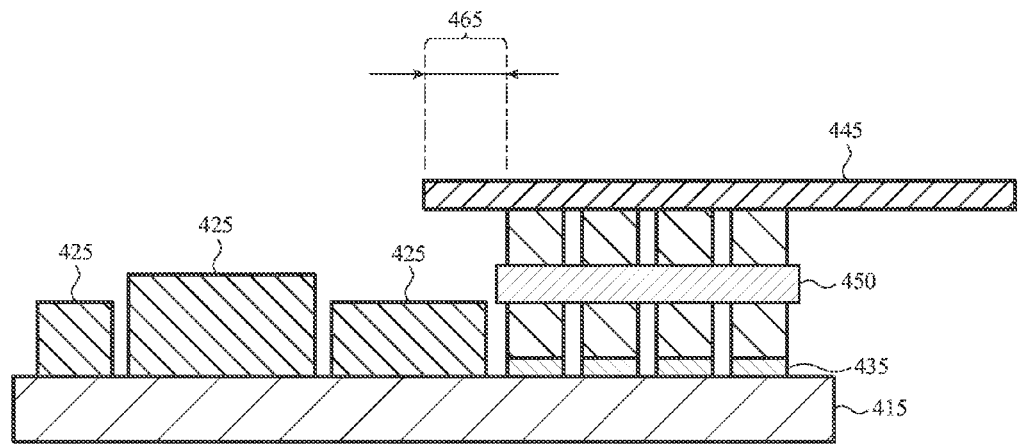
FIG. 4B illustrates a side view of a printed circuit board having a pin connector according to one or more embodiments of the present disclosure.

FIG. 4B illustrates a side view of a printed circuit board 415 having a pin connector 450 coupled thereto according to one or more embodiments of the present disclosure. In certain embodiments, the pin connector 450 may be similar to the pin connector 105 shown and described above with respect to FIGS. 1A-1E and 1G. In addition, embodiments of the present disclosure shown in FIG. 4B provide a pin connector 450 that causes the overhang 465 of the connector 445 to occur in a different plane than the plane of the components 420. For example, as shown in FIG. 4B, the pin connector 450 may be coupled to the printed circuit board 415 using a plurality of pads 435 (or by some other soldering process). However, the height of the pin connector 450 causes the overhang 465 of the connector 445 to be higher than if the pin connector 450 was not present, and thus in a different plane than that occupied by the components 420. As such, and as shown in FIG. 4B, one or more components 425 may be placed beneath the overhang 465 of the connector 445. As a result, additional components 420 may be placed on the printed circuit board 415 in a higher density or the size of the printed circuit board 410 may be reduced to make room for other components such as described above. These benefits may be realized while still maintaining the overhang 465 distance required by the connector 445.

The description and illustration of one or more embodiments provided in this disclosure are not intended to limit or restrict the scope of the present disclosure as claimed. The embodiments, examples, and details provided in this disclosure are considered sufficient to convey possession and enable others to make and use the best mode of the claimed embodiments. Additionally, the claimed embodiments should not be construed as being limited to any embodiment, example, or detail provided above. Regardless of whether shown and described in combination or separately, the various features, including structural features and methodological features, are intended to be selectively included, omitted or rearranged to produce an embodiment with a particular set of features. Having been provided with the description and illustration of the present application, one skilled in the art may envision variations, modifications, and alternate embodiments falling within the spirit of the broader aspects of the embodiments described herein that do not depart from the broader scope of the claimed embodiments.

We claim:

1. An electrical component, comprising:
a printed circuit board;
an array of electrical conductors coupled to the printed circuit board and affixed to a sleeve, each of the array of electrical conductors extending through the sleeve and separated by a gap;
an over-molded structure formed over the array of electrical conductors and the circuit board wherein the over-molded structure encompasses the array of electrical conductors between the sleeve and the printed circuit board; and
an electrical connector coupled to the array of electrical conductors opposite the printed circuit board.

2. The electrical component of claim 1, wherein the array of electrical conductors comprise at least one electrical pin.

3. The electrical component of claim 1, wherein the array of electrical conductors are insert molded with the sleeve.

4. The electrical component of claim 1, further comprising a shielding layer disposed on at least a portion of the printed circuit board.

5. The electrical component of claim 1, wherein the electrical connector is coupled to the array of electrical conductors using a bumping and soldering process.

6. The electrical component of claim 1, wherein the electrical connector is a flexible connector.

7. An electrical component, comprising:
a printed circuit board comprising at least one module;
a pin connector coupled to the printed circuit board, the pin connector having a height dimension; and
an electrical connector coupled to the pin connector opposite the printed circuit board, the electrical connector having an overhang extending beyond the pin connector and over at least a portion of the module.

8. The electrical component of claim 7, wherein the overhang extends over multiple modules of the printed circuit board such that the multiple modules are placed in a higher density arrangement.

9. The electrical component of claim 7, wherein a size of the printed circuit board is based on a size of the overhang.

10. The electrical component of claim 7, wherein the pin connector is coupled to the printed circuit board using a soldering process.

11. The electrical component of claim 7, wherein the electrical connector is a flexible connector.

12. An electrical component, comprising:
a printed circuit having a module;
an array of pins coupled to the circuit board and affixed within a sleeve to form a pin connector, two pins of the array of pins being separated by an offset;
an overmolded layer integrally formed over a portion of the at least one module and a portion of the array of pins,
wherein:
the overmolded layer has a first height at the module and a second height at the offset; and
the second height is less than the first height and at least a portion of the two pins are exposed within the offset.

13. The electrical component of claim 12, further comprising a fiducial marking provided on the sleeve.

14. The electrical component of claim 12, wherein the sleeve comprises an alignment feature.

15. The electrical component of claim 12, wherein the molded layer is provided over the at least the portion of the module and the pin connector by an over-molding process.

16. The electrical component of claim 12, wherein the pin connector is coupled to the printed circuit board using a soldering process.

17. The electrical component of claim 12, further comprising an electrical connector coupled to the pin connector.

18. The electrical component of claim 17, wherein the electrical connector comprises an overhang.

19. The electrical component of claim 17, wherein the electrical connector is coupled to the pin connector using a soldering process.

20. The electrical component of claim 17, wherein the electrical connector is a flexible connector.

* * * * *